US012708040B2

United States Patent
(12) United States Patent
Zuo

(10) Patent No.: US 12,708,040 B2
(45) Date of Patent: Aug. 11, 2026

(54) SEMICONDUCTOR PACKAGE STRUCTURE AND METHOD FOR FABRICATING THE SAME

(71) Applicant: CHANGXIN MEMORY TECHNOLOGIES, INC., Hefei City (CN)

(72) Inventor: Mingxing Zuo, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 645 days.

(21) Appl. No.: 18/166,465

(22) Filed: Feb. 8, 2023

(65) Prior Publication Data

US 2024/0014190 A1 Jan. 11, 2024

Related U.S. Application Data

(63) Continuation of application No. PCT/CN2022/115802, filed on Aug. 30, 2022.

(30) Foreign Application Priority Data

Jul. 8, 2022 (CN) ......................... 202210806527.8

(51) Int. Cl.
*H01L 25/10* (2006.01)
*H01L 23/00* (2006.01)
(Continued)

(52) U.S. Cl.
CPC ........ *H01L 25/105* (2013.01); *H01L 23/3128* (2013.01); *H01L 23/3157* (2013.01);
(Continued)

(58) Field of Classification Search
CPC ............... H01L 25/105; H01L 23/3128; H01L 23/3157; H01L 23/42; H01L 23/5383;
(Continued)

(56) References Cited

U.S. PATENT DOCUMENTS 7,026,709 B2 4/2006 Tsai et al.
7,354,800 B2 4/2008 Carson
(Continued)

FOREIGN PATENT DOCUMENTS

CN 1731917 A 2/2006
CN 101075596 A 11/2007
(Continued)

OTHER PUBLICATIONS

U.S. office action in U.S. Appl. No. 17/935,068, mailed on Sep. 24, 2025.

(Continued)

*Primary Examiner* — Thanh Y. Tran
(74) *Attorney, Agent, or Firm* — Syncoda LLC; Feng Ma

(57) ABSTRACT

A semiconductor package structure includes a first package structure and a second package structure. The first package structure includes a chip stacking structure and a molding compound. A first conductive block is disposed on the chip stacking structure. The molding compound wraps the chip stacking structure and exposes the first conductive block. The second package structure is disposed on the chip stacking structure and electrically connected to the first conductive block. A gap is formed between the first package structure and the second package structure.

17 Claims, 6 Drawing Sheets

(51) Int. Cl.

| | |
|---|---|
| ***H01L 23/31*** | (2006.01) |
| ***H01L 23/42*** | (2006.01) |
| ***H01L 23/538*** | (2006.01) |
| ***H01L 25/00*** | (2006.01) |
| ***H01L 25/065*** | (2023.01) |

(52) U.S. Cl.
CPC .......... *H01L 23/42* (2013.01); *H01L 23/5383* (2013.01); *H01L 24/16* (2013.01); *H01L 24/48* (2013.01); *H01L 25/0657* (2013.01); *H01L 25/50* (2013.01); *H01L 24/32* (2013.01); *H01L 24/73* (2013.01); *H01L 2224/16145* (2013.01); *H01L 2224/32145* (2013.01); *H01L 2224/32225* (2013.01); *H01L 2224/48227* (2013.01); *H01L 2224/73265* (2013.01); *H01L 2225/06562* (2013.01)

(58) Field of Classification Search
CPC ..... H01L 24/16; H01L 24/48; H01L 25/0657; H01L 25/50; H01L 24/32; H01L 24/73; H01L 2224/16145; H01L 2224/32145; H01L 2224/48227; H01L 2224/73265
See application file for complete search history.

(56) References Cited

U.S. PATENT DOCUMENTS

| | | | |
|---|---|---|---|
| 7,723,159 | B2 | 5/2010 | Do |
| 7,800,211 | B2 | 9/2010 | Yang et al. |
| 7,927,917 | B2 | 4/2011 | Pagaila et al. |
| 8,198,735 | B2 | 6/2012 | Chow |
| 8,227,925 | B2 | 7/2012 | Song et al. |
| 8,309,397 | B2 | 11/2012 | Shim |
| 8,699,232 | B2 | 4/2014 | Choi |
| 8,962,393 | B2 | 2/2015 | Pagaila |
| 9,595,509 | B1 | 3/2017 | Yap |
| 10,410,968 | B2 | 9/2019 | Park |
| 11,211,334 | B2 | 12/2021 | Lin et al. |
| 2003/0219969 | A1 | 11/2003 | Saito et al. |
| 2004/0145039 | A1 | 7/2004 | Shim et al. |
| 2005/0023657 | A1 | 2/2005 | Tsai et al. |
| 2006/0244157 | A1 | 11/2006 | Carson |
| 2008/0227238 | A1 | 9/2008 | Ko et al. |
| 2009/0001540 | A1 | 1/2009 | Yang et al. |
| 2009/0079091 | A1 | 3/2009 | Song et al. |
| 2009/0085225 | A1 | 4/2009 | Park |
| 2009/0091015 | A1 | 4/2009 | Shen et al. |
| 2009/0236718 | A1 | 9/2009 | Yang |
| 2009/0243068 | A1 | 10/2009 | Kuan et al. |
| 2010/0046183 | A1 | 2/2010 | Park et al. |
| 2010/0072593 | A1 | 3/2010 | Kim et al. |
| 2010/0148354 | A1 | 6/2010 | Choi et al. |
| 2010/0244221 | A1 | 9/2010 | Ko |
| 2010/0258930 | A1 | 10/2010 | Oh |
| 2010/0320582 | A1 | 12/2010 | Pagaila et al. |
| 2011/0062591 | A1 | 3/2011 | Choi et al. |
| 2011/0127662 | A1 | 6/2011 | Yang et al. |
| 2011/0133325 | A1 | 6/2011 | Moon |
| 2011/0193205 | A1 | 8/2011 | Hsieh |
| 2012/0146243 | A1 | 6/2012 | Song et al. |
| 2012/0217645 | A1 | 8/2012 | Pagaila |
| 2012/0319267 | A1 | 12/2012 | Moon et al. |
| 2013/0075889 | A1 | 3/2013 | Pagaila et al. |
| 2014/0103527 | A1 | 4/2014 | Marimuthu et al. |
| 2014/0291821 | A1 | 10/2014 | Song |
| 2015/0102506 | A1 | 4/2015 | Song et al. |
| 2015/0115466 | A1 | 4/2015 | Kim |
| 2015/0270232 | A1* | 9/2015 | Chen .................... H01L 25/105 257/691 |
| 2016/0172337 | A1 | 6/2016 | Kim |
| 2016/0343691 | A1 | 11/2016 | Chen et al. |
| 2017/0069607 | A1 | 3/2017 | Yap |
| 2017/0141043 | A1 | 5/2017 | Park |
| 2017/0228529 | A1 | 8/2017 | Huang et al. |
| 2018/0005974 | A1 | 1/2018 | Chiu et al. |
| 2019/0013299 | A1 | 1/2019 | Lee |
| 2019/0252772 | A1 | 8/2019 | Ndip |
| 2019/0296002 | A1 | 9/2019 | Pei et al. |
| 2019/0378826 | A1 | 12/2019 | Kim |
| 2020/0020637 | A1 | 1/2020 | Kim et al. |
| 2020/0066663 | A1 | 2/2020 | Aleksov et al. |
| 2020/0194331 | A1 | 6/2020 | Kim et al. |
| 2020/0312783 | A1 | 10/2020 | Min et al. |
| 2020/0381406 | A1 | 12/2020 | Dominguez et al. |
| 2021/0035895 | A1 | 2/2021 | Oh et al. |
| 2021/0035913 | A1 | 2/2021 | Park et al. |
| 2021/0050294 | A1 | 2/2021 | Tsai et al. |
| 2021/0343617 | A1 | 11/2021 | Kim et al. |
| 2021/0351172 | A1 | 11/2021 | Pei et al. |
| 2022/0122896 | A1 | 4/2022 | Wang |
| 2022/0130764 | A1 | 4/2022 | Lin et al. |
| 2022/0199549 | A1 | 6/2022 | Min et al. |
| 2022/0199593 | A1 | 6/2022 | Yang et al. |
| 2023/0052194 | A1* | 2/2023 | Kim ....................... H01L 25/18 |

FOREIGN PATENT DOCUMENTS

| | | | |
|---|---|---|---|
| CN | 103219296 | A | 7/2013 |
| CN | 204102862 | U | 1/2015 |
| CN | 104576557 | A | 4/2015 |
| CN | 105161435 | A | 12/2015 |
| CN | 103219296 | B | 4/2016 |
| CN | 106711094 | A | 5/2017 |
| CN | 107527877 | A | 12/2017 |
| CN | 104576557 | B | 8/2018 |
| CN | 110581121 | A | 12/2019 |
| CN | 110718528 | A | 1/2020 |
| CN | 110797325 | A | 2/2020 |
| CN | 111819689 | A | 10/2020 |
| CN | 113113318 | A | 7/2021 |
| CN | 114664761 | A | 6/2022 |
| EP | 3258486 | A1 | 12/2017 |
| EP | 3399548 | A1 | 11/2018 |
| JP | S60160645 | A | 8/1985 |
| JP | 2002217331 | A | 8/2002 |
| JP | 2004172157 | A | 6/2004 |
| JP | 2005026680 | A | 1/2005 |
| JP | 2010212605 | A | 9/2010 |
| JP | 2010278318 | A | 12/2010 |
| JP | 2011233672 | A | 11/2011 |
| KR | 100890073 | B1 | 3/2009 |
| KR | 20090091486 | A | 8/2009 |
| KR | 20090091487 | A | 8/2009 |
| KR | 1020170094483 | A | 8/2017 |
| KR | 20180004658 | A | 1/2018 |
| KR | 1020190093134 | A | 8/2019 |
| KR | 1020190093194 | A | 8/2019 |
| KR | 1020210016216 | A | 2/2021 |
| TW | 200950132 | A | 12/2009 |
| TW | 201128748 | A | 8/2011 |
| TW | 201314812 | A | 4/2013 |
| TW | 201415586 | A | 4/2014 |
| TW | 201532234 | A | 8/2015 |
| TW | 201620102 | A | 6/2016 |
| TW | 202042355 | A | 11/2020 |
| TW | 202044520 | A | 12/2020 |
| TW | 202101685 | A | 1/2021 |
| TW | 202109800 | A | 3/2021 |
| TW | 202121513 | A | 6/2021 |
| TW | 202125725 | A | 7/2021 |
| TW | 202129904 | A | 8/2021 |
| TW | 202209581 | A | 3/2022 |
| TW | M627599 | U | 6/2022 |

OTHER PUBLICATIONS

U.S. office action in U.S. Appl. No. 17/952,404, mailed on Sep. 23, 2025.

European office action in U.S. Appl. No. 22/793,375, mailed on Oct. 15, 2025.

JP first office action in application No. 2022-562587, mailed on Oct. 15, 2024.

(56) References Cited

OTHER PUBLICATIONS

First Office Action of the Taiwanese application No. 111133935, issued on May 25, 2023. 8 pages with English abstract.
Singapore office action and written opinion in application No. 11202254069A, mailed on May 23, 2025.
KR first office action in application No. 10-2022-7040844, mailed on Mar. 29, 2024.
JP first office action in application No. 2022-566266, mailed on Oct. 8, 2024.
JP first office action in application No. 2022-563494, mailed on Oct. 1, 2024.
US office action in U.S. Appl. No. 17/951,722, mailed on Jun. 11, 2025.
International Search Report in the international application No. PCT/CN2022/115802, mailed on Dec. 19, 2022, 4 pages.
Second Office Action of the Taiwanese application No. 111133935, issued on Aug. 25, 2023, 10 pages with English abstract.
JP office action in application No. 2022-562492, mailed on Apr. 11, 2025.
JP office action in application No. 2022-564372, mailed on Apr. 22, 2025.
JP first office action in application No. 2022-562492, mailed on Sep. 3, 2024.
KR first office action in application No. 10-2022-7041847, mailed on Mar. 29, 2024.
US office action in U.S. Appl. No. 18/152,188, mailed on May 20, 2025.
US office action in U.S. Appl. No. 18/154,739, mailed on Feb. 5, 2026.

* cited by examiner

SEMICONDUCTOR PACKAGE STRUCTURE AND METHOD FOR FABRICATING THE SAME

CROSS-REFERENCE TO RELATED APPLICATIONS

This is a continuation of International Application No. PCT/CN2022/115802 filed on Aug. 30, 2022, which claims priority to Chinese Patent Application No. 202210806527.8 filed on Jul. 8, 2022. The disclosures of the above-referenced applications are hereby incorporated by reference in their entirety.

BACKGROUND

All departments, industries and regions continually require lighter, faster, smaller, more functional, more reliable and more cost-effective products for the electronics industry. In order to meet these growing requirements from many different consumers, more circuits are required to be integrated to provide required functions. In almost all applications, there is a growing requirement for reducing sizes, enhancing performance and improving the functions of the integrated circuits.

SUMMARY

The disclosure relates to the field of semiconductor technologies, and in particular, to a semiconductor package structure and a method for fabricating the same.

In view of this, embodiments of the disclosure provide a semiconductor package structure and a method for fabricating the same.

A first aspect of an embodiment of the disclosure provides a semiconductor package structure, including a first package structure and a second package structure.

The first package structure includes a chip stacking structure and a molding compound. A first conductive block is disposed on the chip stacking structure. The molding compound wraps the chip stacking structure and exposes the first conductive block.

The second package structure is disposed on the chip stacking structure and electrically connected to the first conductive block.

A gap is formed between the first package structure and the second package structure.

A second aspect of an embodiment of the disclosure provides a method for fabricating a semiconductor package structure, including the following operations.

A first package structure is provided. The first package structure includes a chip stacking structure and a molding compound. A first conductive block is disposed on the chip stacking structure. The molding compound wraps the chip stacking structure and exposes the first conductive block.

A second package structure is provided, and disposed on the chip stacking structure. The second package structure is electrically connected to the first conductive block.

A gap is formed between the first package structure and the second package structure.

BRIEF DESCRIPTION OF THE DRAWINGS

In order to more clearly illustrate the technical solutions in the embodiments of the disclosure or conventional technologies, the drawings used in the technical description of the embodiments will be briefly described below. It is apparent that the drawings in the following descriptions are merely some embodiments of the disclosure. Other drawings can be obtained from those skilled in the art according to these drawings without any creative work.

In the drawings.

Figure 1:
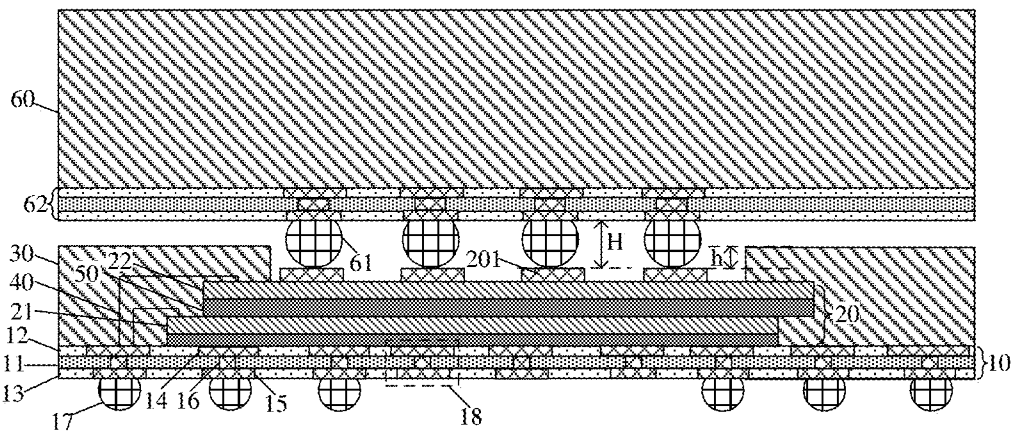
FIG. 1 is a schematic structural diagram of a semiconductor package structure according to an embodiment of the disclosure.

1—Circular ring; 2—Carrier band;

10—Base plate; 11—Base plate substrate; 12—Base plate upper insulating dielectric layer; 13—Base plate lower insulating dielectric layer; 14—First conductive pattern; 15—Second conductive pattern; 16—Signal channel; 17—Base plate connecting bump; 18—Virtual channel;

20—Chip stacking structure; 21—First chip; 22—Second chip; 210—First surface; 220—Second surface; 201—First conductive block; 202—Second conductive block; 203—First signal hole; 204—Second solder ball;

30—Molding compound; 301—First filler;

40—Lead wire;

50—Bonding layer; 51—First bonding layer; 52—Second bonding layer;

60—Second package structure; 61—First solder ball; 62—Second base plate;

70—Filling layer; 701—Second filler.

DETAILED DESCRIPTION

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference sign represents the same element throughout the drawings.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Spatial relation terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed steps and detailed structures are presented in the following description, so as to explain the technical solutions of the disclosure. Preferred embodiments of the disclosure are described in detail below, however, the disclosure may also have other implementations in addition to these detailed descriptions.

An embodiment of the disclosure provides a semiconductor package structure. FIG. 1 is a schematic structural diagram of a semiconductor package structure according to an embodiment of the disclosure.

Referring to FIG. 1, the semiconductor package structure includes: a first package structure and a second package structure 60. The first package structure includes a chip stacking structure 20 and a molding compound 30. A first conductive block 201 is disposed on the chip stacking structure 20. The molding compound 30 wraps the chip stacking structure 20 and exposes the first conductive block 201.

The second package structure 60 is disposed on the chip stacking structure 20 and electrically connected to the first conductive block 201.

A gap is formed between the first package structure and the second package structure 60.

In embodiments of the disclosure, by disposing a first conductive block on a chip stacking structure, and using the first conductive block to connect an independent first package structure and an independent second package structure, the first conductive block acts as an intermediary, so that connection is achieved without additionally using other intermediary structures, thereby reducing a package height of a semiconductor package structure. In addition, since each of the first package structure and the second package structure is independently packaged, the first package structure and the second package structure may be respectively tested, so that failure analysis can be performed more rapidly. Therefore, after the semiconductor package structure is assembled, testing may not be required to be performed on an entire structure. Since a gap is formed between the second package structure and the first package structure, a spacing between the second package structure and the first package structure can be increased. Therefore, the heat dissipation efficiency of the second package structure can be increased, and the impact of heat to chips can be reduced.

In an embodiment, the first package structure further includes a base plate 10. The base plate 10 includes an upper surface and a lower surface that are disposed opposite to each other. The upper surface is provided with a first conductive pattern 14 and the lower surface is provided a second conductive pattern 15.

The base plate 10 further includes a signal channel 16 located between the upper surface and the lower surface.

The signal channel 16 is connected to the first conductive pattern 14 and the second conductive pattern 15.

In some embodiments, the base plate 10 may be a Printed Circuit Board (PCB) or a redistribution base plate.

The base plate 10 includes a base plate substrate 11, and a base plate upper insulating dielectric layer 12 and a base plate lower insulating dielectric layer 13 that are respectively disposed on an upper surface and a lower surface of the base plate substrate 11.

The base plate substrate 11 may be a silicon substrate, a germanium substrate, a silicon germanium substrate, a silicon carbide substrate, an Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as Silicon-Germanium On Insulator (SGOI).

The base plate upper insulating dielectric layer 12 and the base plate lower insulating dielectric layer 13 may be solder mask layers. For example, materials of the base plate upper insulating dielectric layer 12 and the base plate lower insulating dielectric layer 13 may be green paint.

The first conductive pattern 14 is located in the base plate upper insulating dielectric layer 12. The second conductive pattern 15 is located in the base plate lower insulating dielectric layer 13. The signal channel 16 is located in the base plate substrate 11 and penetrates the base plate substrate 11.

The first conductive pattern 14 and the second conductive pattern 15 may be connection pads, and materials of the first conductive pattern 14 and the second conductive pattern 15 may include at least one of aluminum, copper, nickel, tungsten, platinum, or gold. The signal channel 16 may be a Through-Silicon-Via (TSV).

The first conductive pattern 14 is connected to the second conductive pattern 15 via the signal channel 16, so that transmission of a signal can be performed. In addition, two adjacent first conductive patterns 14 may also be connected to each other via a re-wiring layer, so that transmission of a signal on the base plate can be achieved.

The base plate 10 further includes a base plate connecting bump 17. The base plate connecting bump 17 may electrically connect the semiconductor package structure to an external apparatus, so that at least one of a control signal, a power signal or a grounding signal that is used to operate the chip stacking structure may be received from the external apparatus, or a data signal to be stored in the chip stacking structure may be received from the external apparatus. Alternatively, data in the chip stacking structure may also be provided to the external apparatus.

The base plate connecting bump 17 includes a conductive material. In the embodiment of the disclosure, the base plate connecting bump 17 is a solder ball. It is understandable that, a shape of the base plate connecting bump provided in this embodiment of the disclosure is only a lower and feasible specific implementation in the embodiments of the disclosure, and does not constitute a limitation of the disclosure. The base plate connecting bump may also be a structure with other shapes. The number, spacing, and location of the base plate connecting bumps are not limited to any specific arrangement, and various modifications may be made.

Figure 2:
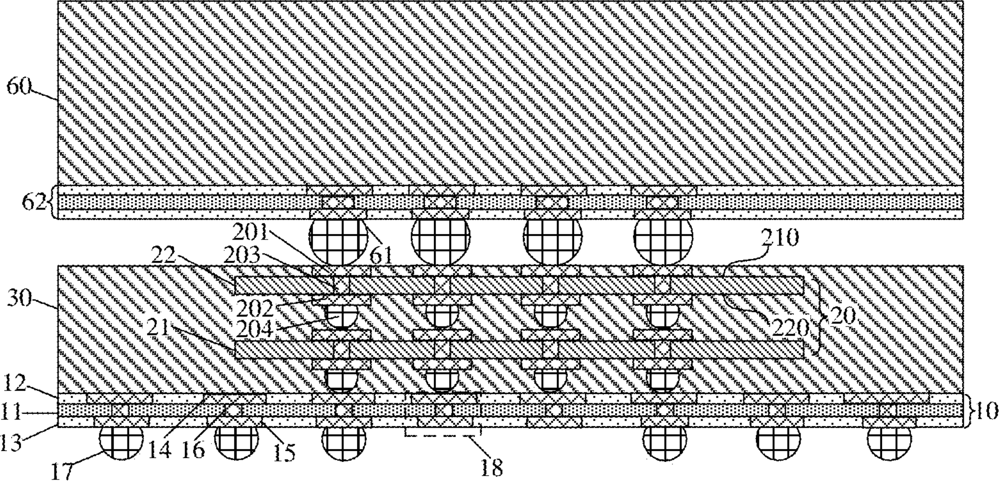
FIG. 2 is a schematic structural diagram of a semiconductor package structure according to another embodiment of the disclosure.

FIG. 2 is a schematic structural diagram of a semiconductor package structure according to another embodiment of the disclosure. In this embodiment of the disclosure, there are two types of connections between the first chip and the second chip and the base plate. One type is, as shown in FIG. 1, to achieve connection by using a bonding layer; and the other type is, as shown in FIG. 2, achieve connection by using the first conductive block, the second conductive block and the first signal hole.

In the embodiment shown in FIG. 1, the chip stacking structure 20 includes the first chip and the second chip.

The first chip 21 is disposed on the base plate 10.

The second chip 22 is disposed on the first chip 21 with an offset.

The first chip 21 and the second chip 22 are respectively connected to the base plate 10 by using lead wires 40. The lead wires 40 are located on the same side of the chip stacking structure 20. Since the second chip 22 is disposed on the first chip 21 with an offset, wire bonding is more convenient.

The first chip 21 and the second chip 22 may be Dynamic Random Access Memory (DRAM) chips, Static Random Access Memory (SRAM) chips, flash memory chips, Electrically Erasable Programmable Read-Only Memory (EEPROM) chips, Phase-change Random Access Memory (PRAM) chips, Magnetic Random Access Memory (MRAM) chips, or Resistive Random Access Memory (RRAM) chips.

The first chip 21 is disposed on the base plate 10 via a bonding layer 50. The base plate 10 further includes a virtual channel 18. The bonding layer 50 is located on the virtual channel 18. A heat conductivity coefficient of the virtual channel 18 is greater than a heat conductivity coefficient of the bonding layer 50.

The bonding layer 50 may be a DAF film.

Figure 6:
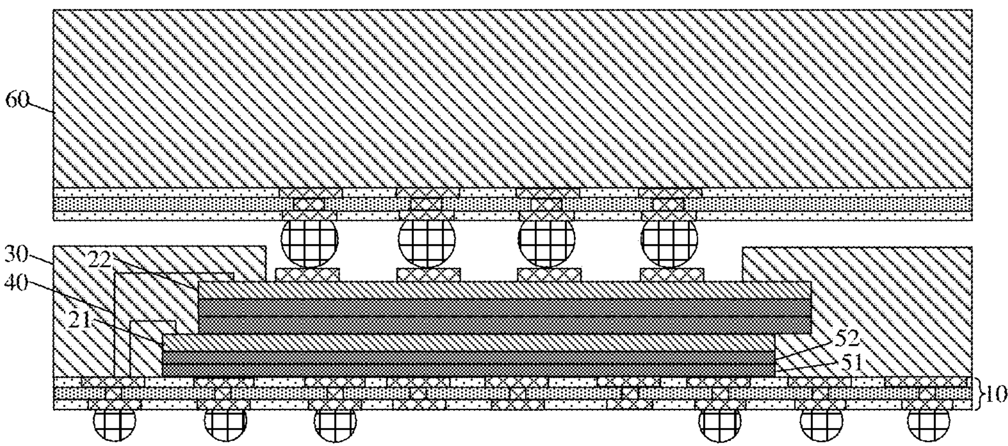
FIG. 6 is a third example of a semiconductor package structure according to an embodiment of the disclosure.

In an embodiment, as shown in FIG. 6, the bonding layer includes a first bonding layer 51 and a second bonding layer 52 located on the first bonding layer 51. An elastic modulus of the second bonding layer 52 is greater than an elastic modulus of the first bonding layer 51.

In this embodiment of the disclosure, the first bonding layer mainly achieves a bonding effect, and the second bonding layer mainly achieves an effect of preventing the chip from warping. Since the elastic modulus of the second bonding layer is relatively high, warping does not occur during cutting. Since the first bonding layer has the relatively low elastic modulus, the bonding force between the base plate and the chip cannot be affected during the subsequent process.

In this embodiment of the disclosure, since the heat conductivity coefficient of the virtual channel is greater than the heat conductivity coefficient of the bonding layer, heat generated by the operation of the chip can be dissipated via the virtual channel. Therefore, the impact of the heat on the device performance can be reduced.

The virtual channel 18 is composed of the first conductive pattern 14, the second conductive pattern 15 and the signal channel 16. However, the base plate connecting bump 17 is not formed under the virtual channel 18, so that virtual channel cannot be used for signal transmission, and only used for a heat dissipation process.

In some embodiments, the heat conductivity coefficient of the virtual channel is greater than the heat conductivity coefficient of a structures composed of other first conductive pattern 14, other second conductive pattern 15 and other signal channel 16 for signal transmission, so that the impact of heat on signal transmission can be reduced.

In an embodiment, the lead wires 40 are connected to a same first conductive pattern 14.

In an embodiment, the molding compound 30 covers the lead wires 40. The lead wires is covered by the molding compound, so that the lead wires can be guaranteed to be in a sealing insulation state and thus does not react with oxygen or other substances in the air, thereby the performance of a device cannot be affected.

In the embodiment shown in FIG. 1, a top surface of the first conductive block 201 is lower than a top surface of the molding compound 30. Since the top surface of the first conductive block is lower than the top surface of the molding compound, a groove is formed, and then the second package structure may be placed in the groove, so as to decrease the height of a device structure.

In an embodiment, the second package structure 60 is disposed on the first conductive block 201 via a first solder ball 61 and the first solder ball 61 protrudes from the molding compound 30.

Specifically, as shown in FIG. 1, a height from the top surface of the first conductive block 201 to the top surface of the molding compound 30 is h, and a height of the first solder ball 61 is H. The height H of the first solder ball 61 is greater than the height h from the top surface of the first conductive block 201 to the top surface of the molding compound 30.

By setting the height of the first solder ball to be greater than the height from the top surface of the first conductive block to the top surface of the molding compound, the contact between the first solder ball and the first conductive block can be tighter, and a gap can be formed between the first package structure and the second package structure, so that the distance between the first package structure and the second package structure can be increased. Therefore, the heat dissipation efficiency of the second package structure can be increased, and the impact of heat dissipation to chips can be reduced. Otherwise, if the height of the first solder ball is less than the height from the top surface of the first conductive block to the top surface of the molding compound, the first solder ball cannot be in contact with the first conductive block, thereby affecting device performance.

The second package structure further includes a second base plate 62. A structure of the second base plate 62 may be the same as a structure of the base plate 10, which is not described herein again.

The second package structure may be a Universal File Store (UFS) chip.

In an embodiment, an included angle between a sidewall, which is between the top surface of the molding compound 30 and the top surface of the second chip 22, of the molding compound 30 and a direction perpendicular to the base plate 10 is greater than or equal to 0° and less than 90°.

For example, as shown in FIG. 1, the included angle between the sidewall, which is between the top surface of the molding compound 30 and the top surface of the second chip 22, of the molding compound 30 and the direction perpendicular to the base plate 10 is 0°. That is to say, the sidewall between the top surface of the molding compound 30 and the top surface of the second chip 22 is perpendicular to the base plate 10. In this embodiment, by setting the sidewall of the molding compound to be a vertical shape, a simpler process can be achieved.

Figure 3:
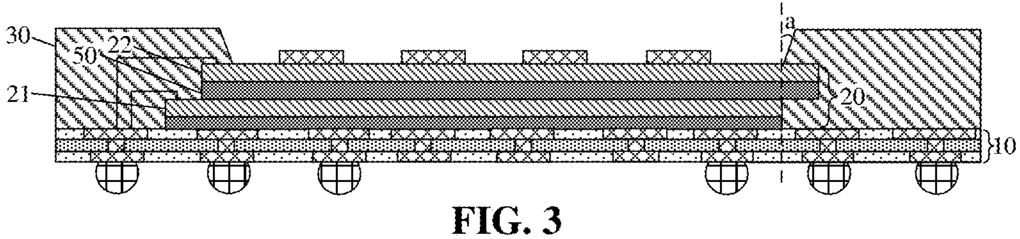
FIG. 3 is a schematic structural diagram of a first package structure according to another embodiment of the disclosure.

As shown in FIG. 3, an included angle $\alpha$ between the sidewall, which is between the top surface of the molding compound 30 and the top surface of the second chip 22, and the direction perpendicular to the base plate 10 is greater than 0° and less than 90°. In this embodiment, by setting the sidewall of the molding compound to be a non-vertical shape, the subsequent interconnection with the second package structure can be more convenient.

In the embodiment shown in FIG. 2, the chip stacking structure includes a plurality of chips.

Each of the plurality of chips includes a first surface 210 and a second surface 220 that are disposed opposite to each other. The first conductive block 201 is located on the first surface 210. A second conductive block 202 is disposed on the second surface 220. The first conductive block 201 is connected to the second conductive block 202 via a first signal hole 203.

A material of the first conductive block 201 and a material of the second conductive block 202 may include at least one of aluminum, copper, nickel, tungsten, platinum, or gold. The first signal hole 203 may be a TSV.

In an embodiment, the second conductive block 202 at the bottom of the chip stacking structure 20 is connected to the first conductive pattern 14 via a second solder ball 204. Two adjacent chips are connected to each other via a second solder ball 204.

As shown in FIG. 2, the chip stacking structure 20 may include the first chip 21 and the second chip 22. The first chip 21 is connected to the second chip 22 via a second conductive block 202 on the second surface 220 of the second chip 22, a first conductive block 201 on the first surface 210 of the first chip 21, and a second solder ball 204 between the first conductive block 201 and the second conductive block 202.

In this embodiment, wire bonding is not required for an electric connection between the first chip and the second chip and the base plate, so that a wire bonding process may be less. In addition, since a signal path between the first chip and the second chip becomes shorter, signal loss can also be reduced.

The base plate 10 further includes a virtual channel 18. The second solder ball 204 is connected to the second conductive pattern 15 via the virtual channel 18.

In an embodiment, the molding compound 30 is further located between two adjacent chips. The molding compound is located between the two adjacent chips. That is to say, the molding compound completely wraps the chip stacking structure, so that the chip stacking structure can be insulated and isolated.

In an embodiment, the first conductive block 201 and the molding compound 30 are coplanar.

Specifically, as shown in FIG. 2, the top surface of the first conductive block 201 on the second chip 22 is coplanar with the top surface of the molding compound 30. In the embodiments of the disclosure, since the finally-formed molding compound is coplanar with the first conductive block, during the formation of the molding compound, a special-shaped mold is not required, but only a mold with a normal shape is required. Since the mold with the normal shape is simple in shape, a fabricating process is simple, and cost is relatively low.

The molding compound is coplanar with the first conductive block. In this way, after the second package structure is connected to the first package structure, there can be a large gap between the first package structure and the second package structure, so that the heat dissipation efficiency of the second package structure can be guaranteed.

If the surface of the molding compound is higher than the surface of the first conductive block, the gap between the first package structure and the second package structure is reduced, which does not facilitate heat dissipation and the filling of a filling layer when the filling layer is formed subsequently. If the surface of the first conductive block is higher than the surface of the molding compound, although the gap may be increased, the molding compound may not completely cover the chips under the first conductive block, resulting in bare chips, which does not facilitate the protection for the chips.

Figure 4:
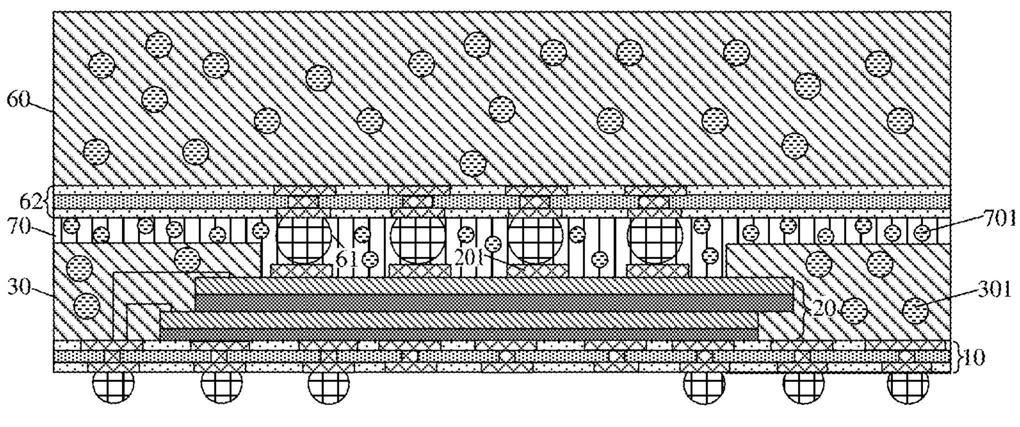
FIG. 4 is a first example of a semiconductor package structure according to an embodiment of the disclosure.
Figure 5:
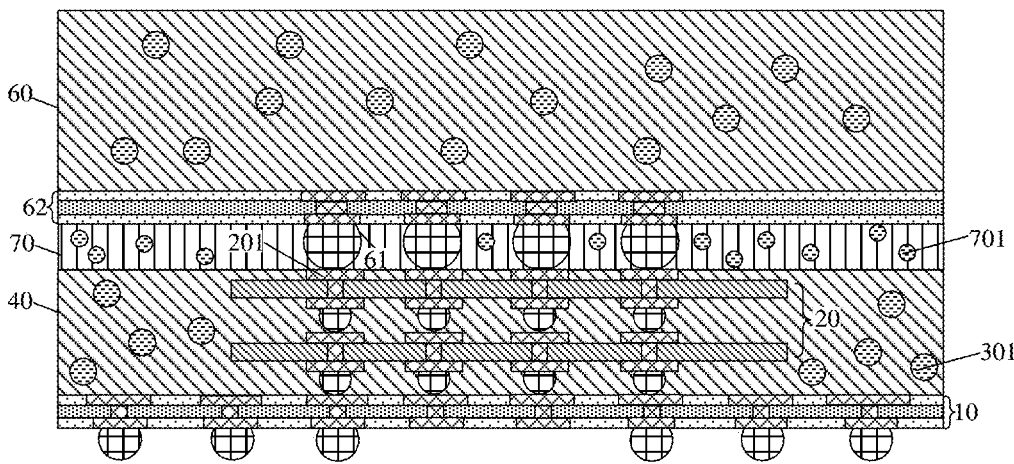
FIG. 5 is a second example of a semiconductor package structure according to an embodiment of the disclosure.

FIG. 4 and FIG. 5 are schematic structural diagrams of a semiconductor package structure according to still another embodiment of the disclosure.

As shown in FIG. 4 and FIG. 5, the semiconductor package structure further includes a filling layer 70. The gap is filled with the filling layer 70.

A heat conductivity coefficient of the filling layer 70 is greater than a heat conductivity coefficient of the molding compound 30.

Through the arrangement of the filling layer, a sealed interface may be formed between the first package structure and the second package structure, so as to reduce the contact of the metal structure of the first package structure and the metal structure of the second package structure with external air or other materials, and perform heat conduction as well. Since the heat conductivity coefficient of the filling layer is relatively large, more heat can be dissipated from the filling layer, so that the impact of the heat to the first package structure can be reduced. In addition, since a thermal expansion coefficient of the filling layer matches thermal expansion coefficients of the first package structure and the second package structure, changes in the volume of the filling layer is small, so that outward pressure cannot be generated to the first package structure and the second package structure. Therefore, the stability of the structure can be guaranteed.

A volume of a filler in the filling layer 70 is greater than a volume of a filler in the molding compound 30.

As shown in FIG. 4 and FIG. 5, the filler in the molding compound 30 is a first filler 301, and the filler in the filling layer 70 is a second filler 701. The volume of the second filler 701 is smaller than the volume of the first filler 301.

Main materials of the molding compound 30 and the filling layer 70 may be epoxy resin, and the fillers may be silicon dioxide powder.

In this embodiment, since the gap filled by the molding compound is relatively large, and the gap between the first package structure and the second package structure is relatively small, a filling layer with large fluidity is selected. The volume of the filler in the filling layer is small, and the fluidity of the main material is large.

The semiconductor package structure provided in the embodiments of the disclosure is applicable to UFS Multi Chip Package (UMCP) of a Package on Package (PoP) structure.

Figure 7:
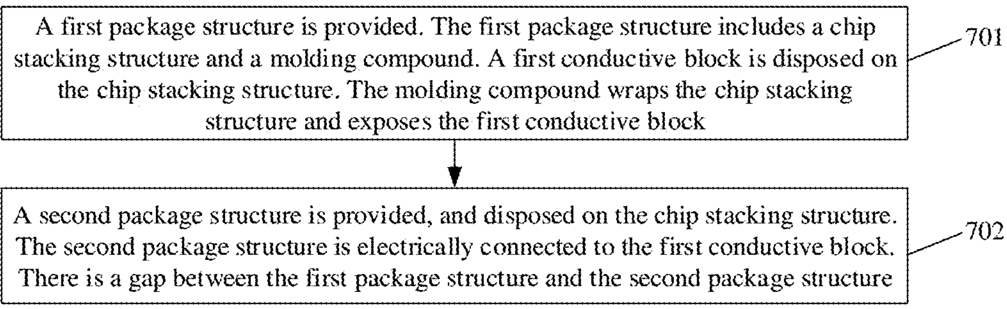
FIG. 7 is a schematic flowchart of a method for fabricating a semiconductor package structure according to an embodiment of the disclosure.

An embodiment of the disclosure further provides a method for fabricating a semiconductor package structure. Referring to FIG. 7 for details, as shown in the figure, the method includes the following steps.

At S701, a first package structure is provided. The first package structure includes a chip stacking structure and a molding compound. A first conductive block is disposed on the chip stacking structure. The molding compound wraps the chip stacking structure and exposes the first conductive block.

At S702, a second package structure is provided, and disposed on the chip stacking structure. The second package structure is electrically connected to the first conductive block. A gap is formed between the first package structure and the second package structure.

The method for fabricating a semiconductor package structure provided in the embodiments of the disclosure is further described in detail below with reference to specific embodiments.

FIG. 8A to FIG. 8F are schematic structural diagrams of a semiconductor package structure during fabricating according to an embodiment of the disclosure. FIG. 9A to FIG. 9C are schematic structural diagrams of a semiconductor package structure during fabricating according to another embodiment of the disclosure. It is to be noted that, in the embodiment shown in FIG. 8A to FIG. 8F and the embodiment shown in FIG. 9A to FIG. 9C, all structures are the same except the chip stacking structure and the structure of the molding compound.

The embodiment shown in FIG. 8A to FIG. 8F is first described in detail.

First, referring to FIG. 8A to FIG. 8D, S701 of providing a first package structure is executed. The first package structure includes a chip stacking structure 20 and a molding compound 30. A first conductive block 201 is disposed on the chip stacking structure 20. The molding compound 30 wraps the chip stacking structure 20 and exposes the first conductive block 201.

Figure 8A:
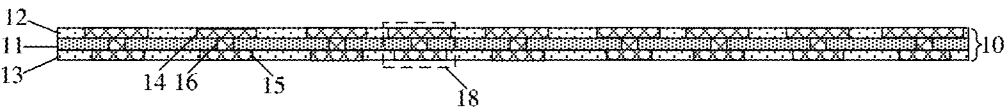
FIG. 8A is a first schematic structural diagram of components during fabricating a semiconductor package structure according to an embodiment of the disclosure.
Figure 9A:
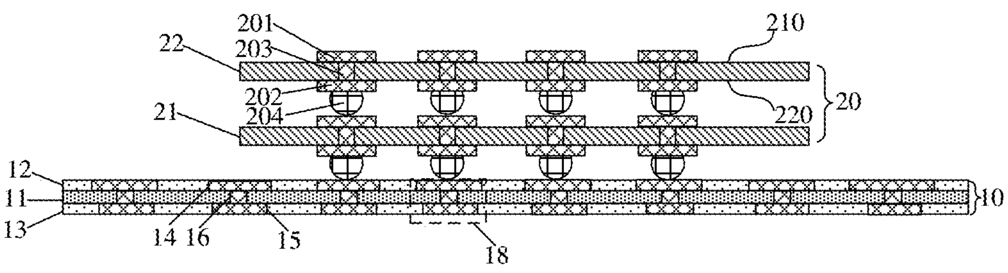
FIG. 9A is a first schematic structural diagram of components during fabricating a semiconductor package structure according to another embodiment of the disclosure.
Figure 9B:
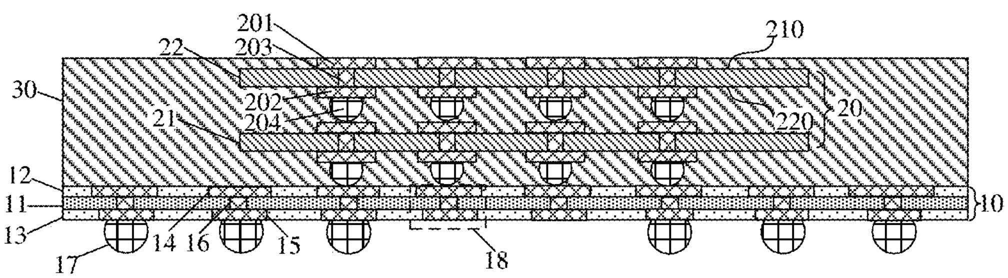
FIG. 9B is a second schematic structural diagram of components during fabricating a semiconductor package structure according to another embodiment of the disclosure.
Figure 9C:
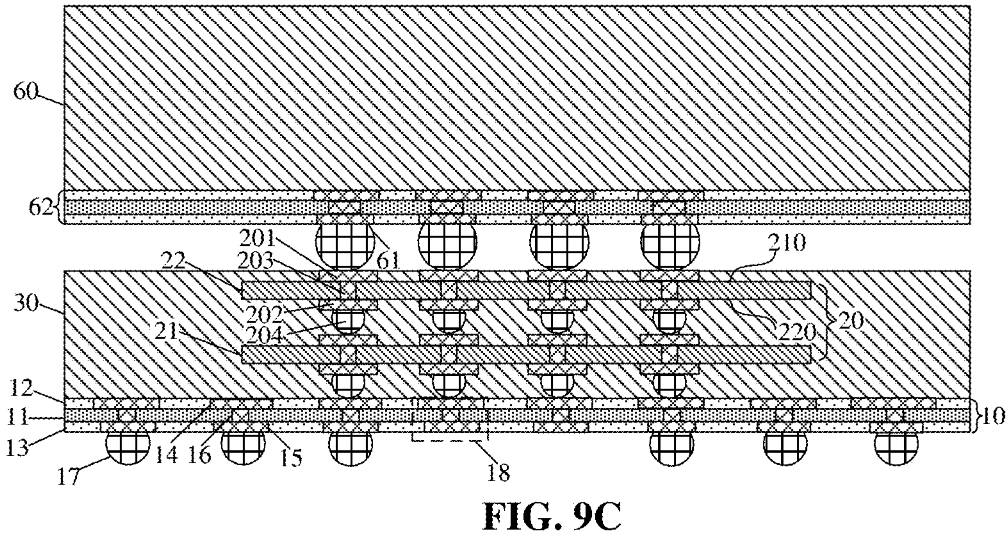
FIG. 9C is a third schematic structural diagram of components during fabricating a semiconductor package structure according to another embodiment of the disclosure.

Specifically, referring to FIG. 8A first, a base plate 10 is provided.

In some embodiments, the base plate 10 may be a PCB or a redistribution base plate.

The base plate 10 includes a base plate substrate 11, and a base plate upper insulating dielectric layer 12 and a base plate lower insulating dielectric layer 13 that are respectively disposed on an upper surface and a lower surface of the base plate substrate 11.

The base plate substrate 11 may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The base plate upper insulating dielectric layer 12 and the base plate lower insulating dielectric layer 13 may be solder mask layers. For example, materials of the base plate upper insulating dielectric layer 12 and the base plate lower insulating dielectric layer 13 may be green paint.

The base plate 10 further includes an upper surface and a lower surface that are disposed opposite to each other. The upper surface and the lower surface are respectively provided with a first conductive pattern 14 and a second conductive pattern 15. The first conductive pattern 14 is located in the base plate upper insulating dielectric layer 12. The second conductive pattern 15 is located in the base plate lower insulating dielectric layer 13. A signal channel 16 is located in the base plate substrate 11 and penetrates the base plate substrate 11.

The first conductive pattern 14 and the second conductive pattern 15 may be connection pads, and materials of the first conductive pattern 14 and the second conductive pattern 15 may include at least one of aluminum, copper, nickel, tungsten, platinum, or gold. The signal channel 16 may be a Through-Silicon-Via (TSV).

The first conductive pattern 14 is connected to the second conductive pattern 15 via the signal channel 16, so that a transmission of a signal can be performed. In addition, two adjacent first conductive patterns 14 may also be connected to each other via a re-distribution layer, so that the transmission of the signal on the base plate can be completed.

The base plate 10 further includes a virtual channel 18. The virtual channel 18 is composed of a first conductive pattern 14, a second conductive pattern 15 and a signal channel 16. However, a base plate connecting bump 17 is not formed under the virtual channel 18, so that signal transmission cannot be performed, and only a heat dissipation process is performed.

In some embodiments, the heat conductivity coefficient of the virtual channel is greater than heat conductivity coefficient of a structure composed of other first conductive pattern 14, other second conductive pattern 15 and other signal channel 16 for signal transmission, so that the impact of heat on signal transmission can be reduced.

Figure 8B:
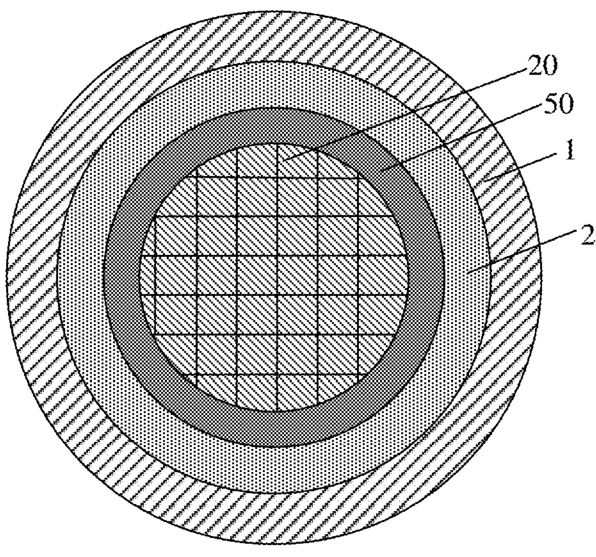
FIG. 8B is a second schematic structural diagram of components during fabricating a semiconductor package structure according to an embodiment of the disclosure.
Figure 8C:
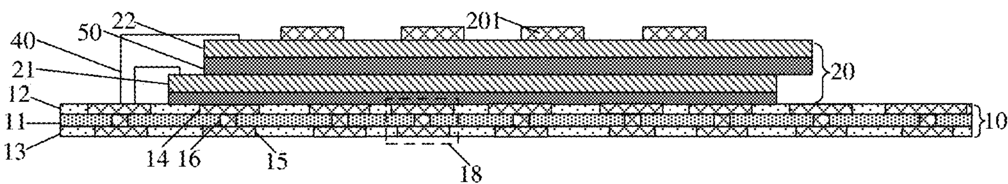
FIG. 8C is a third schematic structural diagram of components during fabricating a semiconductor package structure according to an embodiment of the disclosure.

Next, referring to FIG. 8B and FIG. 8C, a chip stacking structure 20 is formed on the base plate 10.

Specifically, referring to FIG. 8B first, a carrier band 2 is attached to a circular ring 1, and a bonding layer 50 is attached to the carrier band 2; and then a chip at the uppermost layer in the chip stacking structure is attached to the bonding layer 50, and discrete chips are formed after cutting.

Next, referring to FIG. 8C, the cut chips are placed on the base plate 10.

Specifically, the bonding layer 50 is formed on the base plate 10, and then the chip stacking structure 20 is formed on the bonding layer 50.

The bonding layer 50 may be a die attach film (DAF).

In an embodiment, as shown in FIG. 6, the bonding layer includes a first bonding layer 51 and a second bonding layer 52 located on the first bonding layer 51. An elastic modulus of the second bonding layer 52 is greater than an elastic modulus of the first bonding layer 51.

In this embodiment of the disclosure, the first bonding layer mainly achieves a bonding effect, and the second bonding layer mainly achieves an effect of preventing the chip from warping. Since the elastic modulus of the second bonding layer is relatively high, warping does not occur during cutting. The first bonding layer has the relatively low elastic modulus, the bonding force between the base plate and the chip cannot be affected during the subsequent processes.

The bonding layer 50 is located on the virtual channel 18. A heat conductivity coefficient of the virtual channel 18 is greater than a heat conductivity coefficient of the bonding layer 50. In this embodiment of the disclosure, since the heat conductivity coefficient of the virtual channel is greater than the heat conductivity coefficient of the bonding layer, heat generated by the operation of the chip can be dissipated via the virtual channel. Therefore, the impact of the heat on the device performance can be reduced.

The operation of forming the chip stacking structure 20 includes: forming a first chip 21 on the bonding layer 50; and forming a second chip 22 on the first chip 21. The first chip 21 and the second chip 22 are disposed with an offset.

The first chip 21 is also connected to the second chip 22 via a bonding layer 50.

Also referring to FIG. 8C, wire bonding is performed.

Specifically, the first chip 21 and the second chip 22 are respectively connected to the base plate 10 by using lead wires 40. The lead wires 40 are located on the same side of the chip stacking structure 20.

In an embodiment, the lead wires 40 are connected to a same first conductive pattern 14.

Figure 8D:
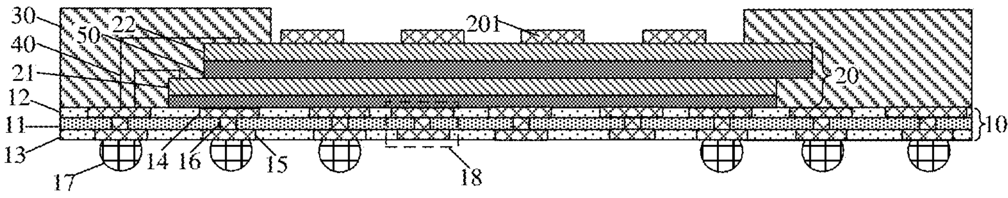
FIG. 8D is a fourth schematic structural diagram of components during fabricating a semiconductor package structure according to an embodiment of the disclosure.

Next, referring to FIG. 8D, a molding compound 30 wrapping the chip stacking structure 20 is formed. The molding compound 30 exposes the first conductive block 201.

In an embodiment, the molding compound 30 covers the lead wires 40. The molding compound covers the lead wires, so that the lead wires can be guaranteed to be in a sealing insulation state and thus does not react with oxygen or other substances in the air, thereby the performance of a device cannot be affected.

A top surface of the first conductive block 201 is lower than a top surface of the molding compound 30. Since the top surface of the first conductive block is lower than the top surface of the molding compound, a groove is formed, and then the second package structure may be placed in the groove, so as to decrease the height of a device structure.

In an embodiment, an included angle between a sidewall which is between the top surface of the molding compound 30 and the top surface of the second chip 22, of the molding compound 30 and a direction perpendicular to the base plate 10 is greater than or equal to 0° and less than 90°.

For example, as shown in FIG. 8D, the included angle between the sidewall, which is between the top surface of the molding compound 30 and the top surface of the second chip 22, of the molding compound 30 and the direction perpendicular to the base plate 10 is 0°. That is to say, the sidewall between the top surface of the molding compound and the top surface of the second chip 22 is perpendicular to the base plate 10. In this embodiment, by setting the sidewall of the molding compound to be a vertical shape, a simpler process can be achieved.

As shown in FIG. 3, an included angle $\alpha$ between the sidewall, which is between the top surface of the molding compound 30 and the top surface of the second chip 22, of the molding compound 30 and the direction perpendicular to the base plate 10 is greater than 0° and less than 90°. In this embodiment, by setting the sidewall of the molding compound to be a non-vertical shape, the subsequent interconnection with the second package structure can be more convenient.

Also referring to FIG. 8D, after the molding compound 30 is formed, a base plate connecting bump 17 is formed on the second conductive pattern 15 of the base plate 10. The base plate connecting bump 17 includes a conductive material.

Figure 8E:
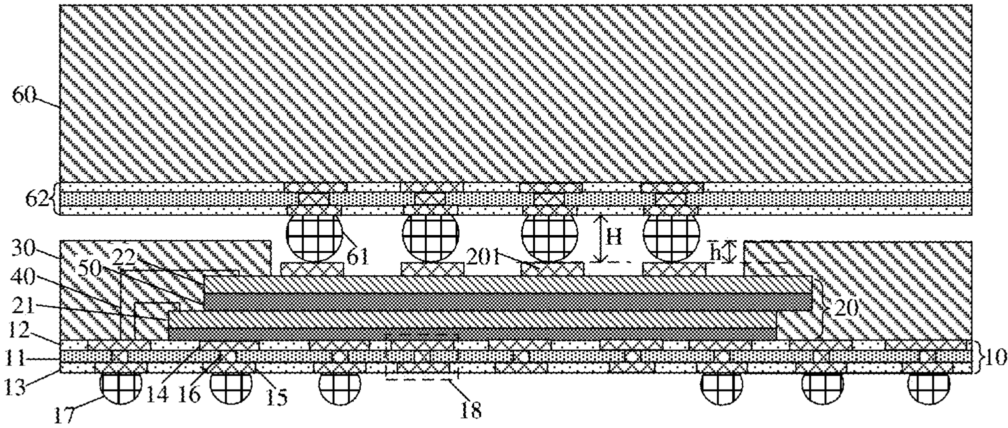
FIG. 8E is a fifth schematic structural diagram of components during fabricating a semiconductor package structure according to an embodiment of the disclosure.

Next, referring to FIG. 8E, S702 is executed. The second package structure 60 is provided, and disposed on the chip stacking structure 20. The second package structure 20 is electrically connected to the first conductive block 201. A gap is formed between the first package structure and the second package structure 60.

Specifically, a first solder ball 61 is formed on the second package structure 60. The first solder ball 61 is electrically connected to the first conductive block 201 and the first solder ball 61 protrudes from the molding compound 30.

As shown in FIG. 8E, a height from a top surface of the first conductive block 201 to a top surface of the molding compound 30 is h, and a height of the first solder ball 61 is H. The height H of the first solder ball 61 is greater than the height h from the top surface of the first conductive block 201 to the top surface of the molding compound 30.

By setting the height of the first solder ball to be greater than the height from the top surface of the first conductive block to the top surface of the molding compound, the contact between the first solder ball and the first conductive block can be tighter, and a gap can be formed between the first package structure and the second package structure, so that a distance between the first package structure and the second package structure can be increased. Therefore, the heat dissipation efficiency of the second package structure can be enhanced, and the impact of heat dissipation to chips can be reduced. Otherwise, if the height of the first solder ball is less than the height from the top surface of the first conductive block to the top surface of the molding compound, the first solder ball cannot be in contact with the first conductive block, thereby affecting device performance.

The second package structure further includes a second base plate 62. A structure of the second base plate 62 may be the same as a structure of the base plate 10, which is not described herein again.

The first solder ball 61 is located on the second base plate 62.

Figure 8F:
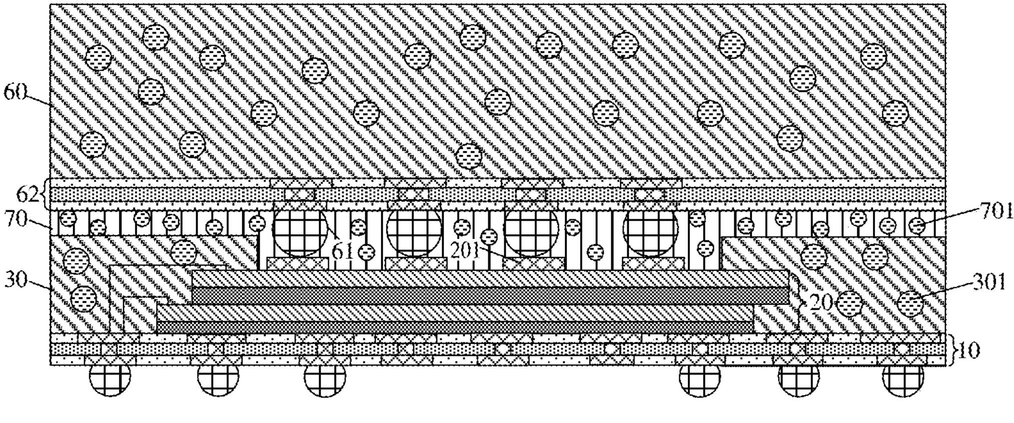
FIG. 8F is a sixth schematic structural diagram of components during fabricating a semiconductor package structure according to an embodiment of the disclosure.

Next, referring to FIG. 8F, a filling layer 70 is formed in the gap between the first package structure and the second package structure 60.

A heat conductivity coefficient of the filling layer 70 is greater than a heat conductivity coefficient of the molding compound 30.

Through the arrangement of the filling layer, a sealed interface may be formed between the first package structure and the second package structure, so as to reduce the contact of metal structures of the first package structure and the second package structure with external air or other materials, and perform heat conduction as well. Since the heat conductivity coefficient of the filling layer is relatively large, more heat can be dissipated from the filling layer, so that the impact of the heat to the first package structure can be reduced. Although the heat conductivity coefficient of the filling layer is relatively large, the volume of the filling layer is relatively small. Therefore, outward pressure cannot be generated to the first package structure and the second package structure. Therefore, the stability of the structure can be guaranteed.

The volume of a filler in the filling layer is less than the volume of a filler in the molding compound.

As shown in FIG. 8F, the filler in the molding compound 30 is a first filler 301, and the filler in the filling layer 70 is a second filler 701. The volume of the second filler 701 is smaller than the volume of the first filler 301.

Main materials of the molding compound 30 and the filling layer 70 may be epoxy resin, and the fillers may be silicon dioxide.

In this embodiment, since the gap filled by the molding compound is relatively large, and the gap between the first package structure and the second package structure is relatively small, a filling layer with large fluidity is selected. The volume of the filler in the filling layer is small, and the fluidity of the main material is large.

Next, the embodiment shown in FIG. 9A to FIG. 9C is described in detail.

First, referring to FIG. 9A, a chip stacking structure 20 is formed on a base plate 10. It is to be noted that, the base plate in this embodiment is the same as the base plate shown in FIG. 8A to FIG. 8E, which is not described herein.

The chip stacking structure 20 includes a plurality of chips. Each chip includes a first surface 210 and a second surface 220 that are disposed opposite to each other. The first conductive block 201 is formed on the first surface 210. A second conductive block 202 is formed on the second surface 220. The first conductive block 201 is connected to the second conductive block 202 via a first signal hole 203.

Materials of the first conductive block 201 and the second conductive block 202 may include at least one of aluminum, copper, nickel, tungsten, platinum, or gold. The first signal hole 203 may be a TSV.

A second conductive block 202 at the bottom of the chip stacking structure 20 is connected to the first conductive pattern 14 via a second solder ball 204. Two adjacent chips are connected to each other via a second solder ball 204.

Specifically, as shown in FIG. 9A, the chip stacking structure 20 includes a first chip 21 and a second chip 22. The first chip 21 is connected to the second chip 22 are connected via a second conductive block 202 on the second surface 220 of the second chip 22, a first conductive block 201 on a first surface 210 of the first chip 21, and a second solder ball 204 between the first conductive block 201 and the second conductive block.

In this embodiment, wire bonding is not required for an electric connection between the first chip and the second chip and the base plate, so that a wire bonding process can be less.

Next, referring to FIG. 9B, the molding compound 30 wrapping the chip stacking structure 20 is formed.

The molding compound 30 is further located between the two adjacent chips. The molding compound is located between the two adjacent chips. That is to say, the molding compound completely wraps the chip stacking structure, so that the chip stacking structure can be insulated and isolated.

In an embodiment, the first conductive block 201 and the molding compound 30 are coplanar.

Specifically, as shown in FIG. 9B, a top surface of the first conductive block 201 on the second chip 22 is coplanar with a top surface of the molding compound 30. In the embodiments of the disclosure, since the finally-formed molding compound is coplanar with the first conductive block, during the formation of the molding compound, a special-shaped mold is not required, but only a mold with a normal shape is required. Since the mold with the normal shape is simple in shape, a fabricating process is simple, and cost is relatively low.

The molding compound is coplanar with the first conductive block. In this way, after the second package structure is connected to the first package structure, there can be a large gap between the first package structure and the second package structure, so that the heat dissipation efficiency of the second package structure can be guaranteed.

If the surface of the molding compound is higher than the surface of the first conductive block, the gap between the first package structure and the second package structure is reduced, which does not facilitate heat dissipation and the filling of a filling layer when the filling layer is formed subsequently. If the surface of the first conductive block is higher than the surface of the molding compound, although the gap may be increased, the molding compound may not cover the chips under the first conductive block, resulting in bare chips, which does not facilitate the protection of the chips.

Next, referring to FIG. 9C, a second package structure 60 is formed on the first package structure. It is to be noted that, the step after the second package structure is formed in this embodiment is the same as the step after the second package structure is formed in the embodiment shown in FIG. 8A to FIG. 8E, which is not described herein.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

In embodiments of the disclosure, by disposing a first conductive block on a chip stacking structure, and using the first conductive block to connect an independent first package structure and an independent second package structure, the first conductive block acts as an intermediary, so that connection is achieved without additionally using other intermediary structures, thereby reducing a package height of a semiconductor package structure. In addition, since each of the first package structure and the second package structure is independently packaged, the first package structure and the second package structure may be respectively tested, so that failure analysis can be performed more rapidly. Therefore, after the semiconductor package structure is assembled, testing may not be required to be performed on an entire structure. Since a gap is formed between the second package structure and the first package structure, a spacing between the second package structure and the first package structure can be increased. Therefore, the heat dissipation efficiency of the second package structure can be increased, and the impact of heat to chips can be reduced.

What is claimed is:

1. A semiconductor package structure, comprising:

a first package structure, comprising a chip stacking structure and a molding compound, wherein a first conductive block is disposed on the chip stacking structure, and a molding compound wraps the chip stacking structure and exposes the first conductive block; and a second package structure, disposed on the chip stacking structure and electrically connected to the first conductive block, wherein a gap is formed between the first package structure and the second package structure;

wherein the first package structure further comprises:

a base plate, comprising an upper surface and a lower surface that are disposed opposite to each other, wherein the upper surface is provided with a first conductive pattern and the lower surface is provided with a second conductive pattern; and the base plate further comprises a signal channel located between the upper surface and the lower surface, and the signal channel is connected to the first conductive pattern and the second conductive pattern;

wherein the chip stacking structure comprises:

a first chip, disposed on the base plate; and a second chip, disposed on the first chip with an offset, the first chip and the second chip are respectively connected to the base plate by using lead wires, and the lead wires are located on a same side of the chip stacking structure.

2. The semiconductor package structure of claim 1, wherein the lead wires are connected to a same first conductive pattern.

3. The semiconductor package structure of claim 1, wherein the molding compound covers the lead wires.

4. The semiconductor package structure of claim 1, wherein a top surface of the first conductive block is lower than a top surface of the molding compound.

5. The semiconductor package structure of claim 4, wherein the second package structure is disposed on the first conductive block via a first solder ball, and the first solder ball protrudes from the molding compound.

6. The semiconductor package structure of claim 1, further comprising a filling layer, wherein the gap is filled with the filling layer.

7. The semiconductor package structure of claim 6, wherein a heat conductivity coefficient of the filling layer is greater than a heat conductivity coefficient of the molding compound.

8. The semiconductor package structure of claim 6, wherein a volume of a filler in the filling layer is less than a volume of a filler in the molding compound.

9. The semiconductor package structure of claim 1, wherein the first chip is disposed on the base plate via a bonding layer, and wherein the base plate further comprises a virtual channel, the bonding layer is located on the virtual channel, and a heat conductivity coefficient of the virtual channel is greater than a heat conductivity coefficient of the bonding layer.

10. The semiconductor package structure of claim 9, wherein the bonding layer comprises a first bonding layer and a second bonding layer, the second bonding layer is located on the first bonding layer, and an elastic modulus of the first bonding layer is less than an elastic modulus of the second bonding layer.

11. A semiconductor package structure, comprising:

a first package structure, comprising a chip stacking structure and a molding compound, wherein a first conductive block is disposed on the chip stacking structure, and a molding compound wraps the chip stacking structure and exposes the first conductive block; and a second package structure, disposed on the chip stacking structure and electrically connected to the first conductive block, wherein a gap is formed between the first package structure and the second package structure;

wherein the semiconductor package structure comprises a filling layer, the gap is filled with the filler layer;

wherein a volume of a filler in the filling layer is less than a volume of a filler in the molding compound.

12. The semiconductor package structure of claim 11, wherein the chip stacking structure comprises:

a plurality of chips, each of which comprising a first surface and a second surface that are disposed opposite to each other, wherein the first conductive block is located on a first surface, a second conductive block is disposed on a second surface, and the first conductive block is connected to the second conductive block via a first signal hole.

13. The semiconductor package structure of claim 12, wherein a second conductive block at a bottom of the chip stacking structure is connected to the first conductive pattern via a second solder ball, and two adjacent chips are connected to each other via a second solder ball.

14. The semiconductor package structure of claim 13, wherein the molding compound is further located between two adjacent chips.

15. The semiconductor package structure of claim 13, wherein the base plate further comprises a virtual channel, and a second solder ball is connected to a second conductive pattern through the virtual channel.

16. The semiconductor package structure of claim 12, wherein the first conductive block is coplanar with the molding compound.

17. The semiconductor package structure of claim 11, wherein a heat conductivity coefficient of the filling layer is greater than a heat conductivity coefficient of the molding compound.

* * * * *